US008791830B2

(12) United States Patent
Moell et al.

(10) Patent No.: US 8,791,830 B2
(45) Date of Patent: Jul. 29, 2014

(54) DEVICE FOR CURRENT MEASURING IN POWER SUPPLY NETWORKS

(75) Inventors: Winfried Moell, Laubach (DE); Oliver Schaefer, Gruenberg (DE)

(73) Assignee: Bender GmbH & Co. KG, Gruenberg (DE)

( * ) Notice: Subject to any disclaimer, the term of this patent is extended or adjusted under 35 U.S.C. 154(b) by 232 days.

(21) Appl. No.: 13/437,454

(22) Filed: Apr. 2, 2012

(65) Prior Publication Data

US 2012/0249336 A1  Oct. 4, 2012

(30) Foreign Application Priority Data

Apr. 1, 2011 (DE) .......................... 10 2011 006 666
Nov. 25, 2011 (EP) ...................................... 11190717

(51) Int. Cl.
*G08B 21/00* (2006.01)
(52) U.S. Cl.
USPC ......................................... 340/646; 340/635
(58) Field of Classification Search
CPC .............. G01R 15/183; G01R 15/186; G01R 19/16547; G01R 19/0092; H01F 38/28
USPC ................................................. 340/646, 635
See application file for complete search history.

(56) References Cited

U.S. PATENT DOCUMENTS

| 4,280,093 | A | * | 7/1981 | Houston .................... 324/117 R |
| 4,345,288 | A | * | 8/1982 | Kampf et al. .................... 361/31 |
| 4,369,491 | A | * | 1/1983 | Rizzi .............................. 363/24 |
| 4,392,171 | A | * | 7/1983 | Kornrumpf ........................ 361/5 |
| 4,525,669 | A | * | 6/1985 | Holberton et al. ............. 324/142 |
| 4,796,148 | A | * | 1/1989 | Ruta ............................... 361/97 |
| 5,610,508 | A | * | 3/1997 | Kammiller .................... 323/358 |
| 7,174,261 | B2 | * | 2/2007 | Gunn et al. ...................... 702/62 |
| 2003/0030954 | A1 | | 2/2003 | Bax et al. |
| 2004/0183522 | A1 | * | 9/2004 | Gunn et al. .................... 324/126 |
| 2007/0136010 | A1 | * | 6/2007 | Gunn et al. ...................... 702/62 |

FOREIGN PATENT DOCUMENTS

| CN | 1238068 A | 12/1999 |
| CN | 201123180 Y | 9/2008 |
| CN | 201466795 U | 5/2010 |
| DE | 10 2005 054 544 A1 | 5/2007 |

OTHER PUBLICATIONS

English Translation of a Chinese Office Action together with English Translation of a Chinese Search Report relating to a parallel Chinese Application No. 201210094109.7 issued Jan. 17, 2014 and served on Mar. 3, 2014.

* cited by examiner

*Primary Examiner* — Travis Hunnings
(74) *Attorney, Agent, or Firm* — Griffin & Szipl, P.C.

(57) ABSTRACT

The present invention relates to a device for current measuring in power supply networks comprising transformers for measuring current, a signal processing apparatus arranged on a printed circuit board and screw fastenings for mounting the device. The cable ducts of the transformers are orientated parallel to the plane of the printed circuit board, which has openings flush to the cable ducts, and the screw fastenings are fastening tabs with mounting holes, spaced so standards-compliant mounting is possible. In an alternate embodiment, the cable ducts are orientated perpendicularly to the plane of the printed circuit board, the screw fastenings are constructed as an angle rail with cable outlets and standards-compliant mounting holes, and the printed circuit board is internally fastened on one side of the angle rail. In another alternate embodiment the transformers are installed with the printed circuit board in a common housing with fastening tabs and standards-compliant mounting holes.

20 Claims, 7 Drawing Sheets

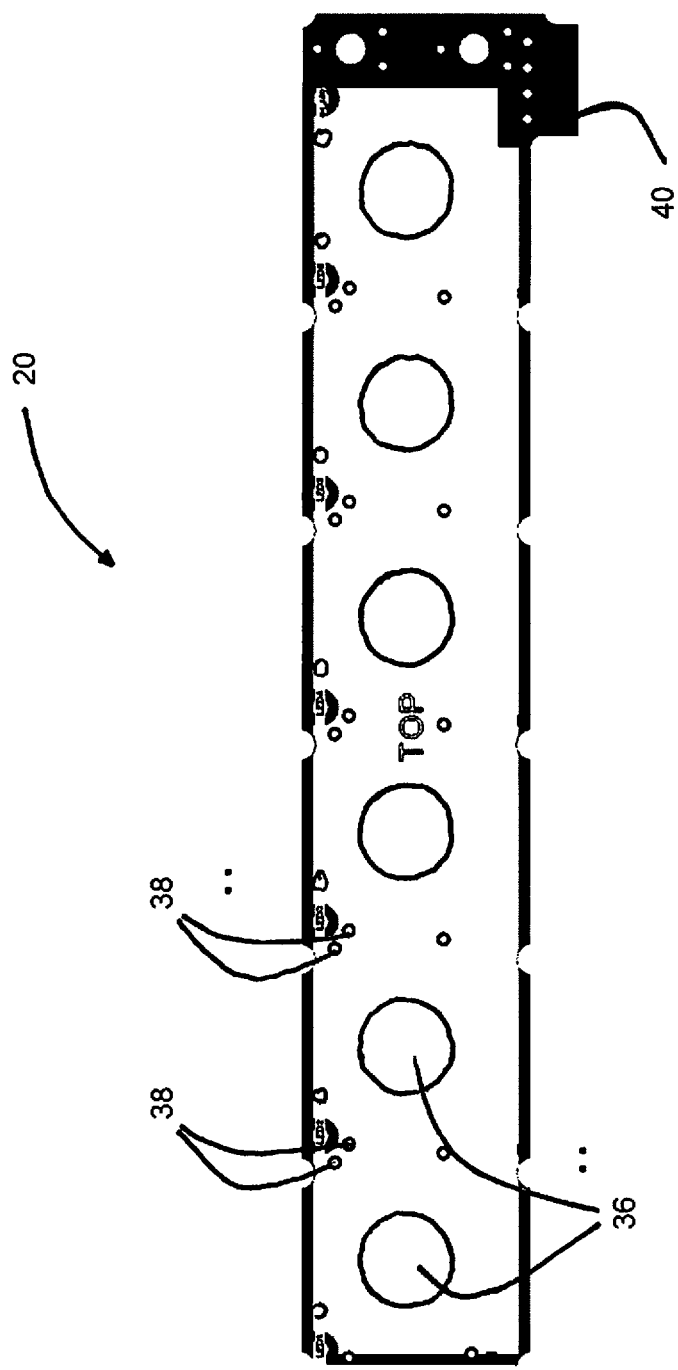

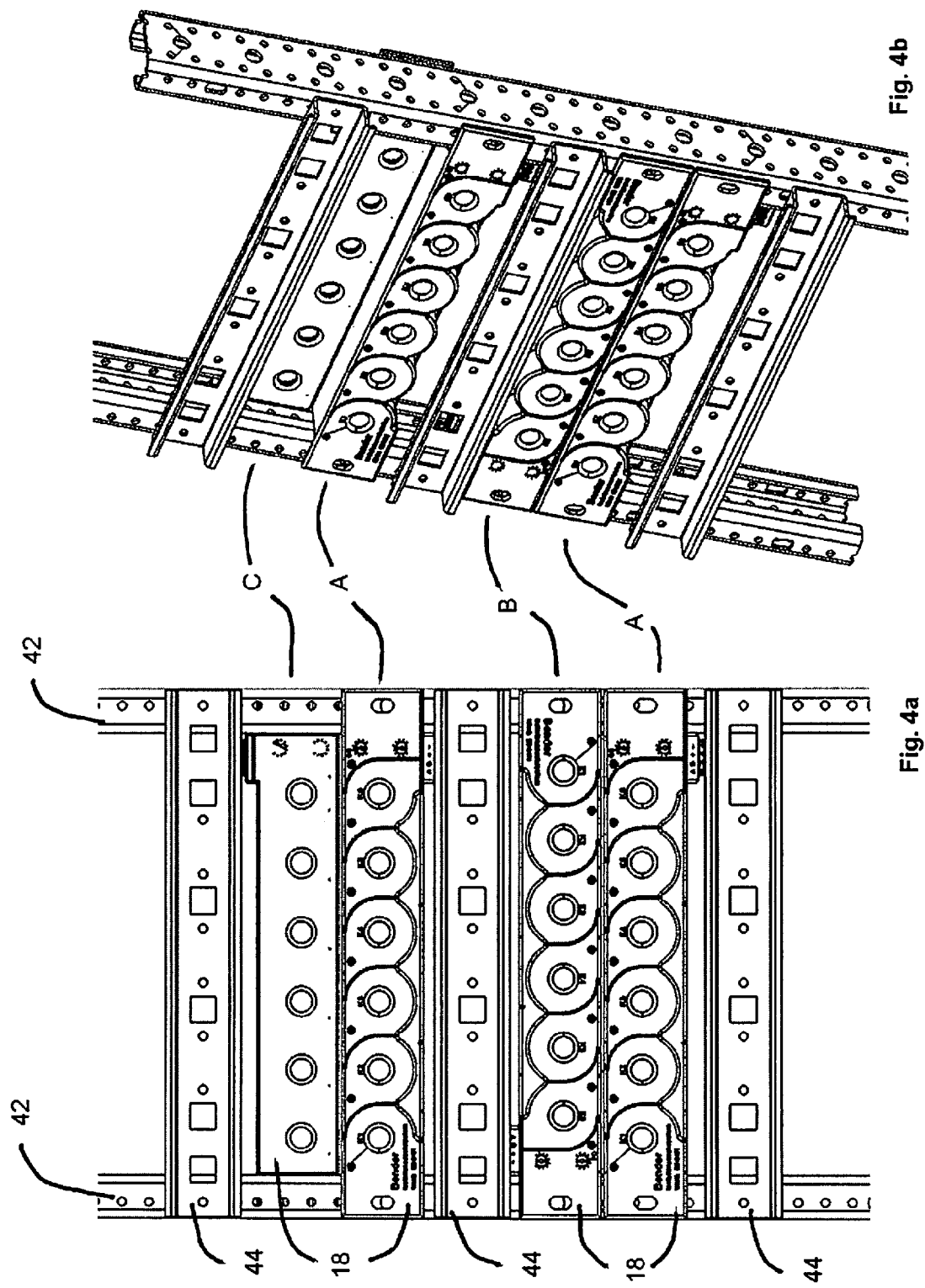

DEVICE FOR CURRENT MEASURING IN POWER SUPPLY NETWORKS

This application claims priority from German Patent Application No. DE 10 2011 006 666.7, filed Apr. 1, 2011, and European Patent Application No. 11190717.6, filed Nov. 25, 2011, the entire disclosures of which are incorporated herein by reference.

FIELD OF THE INVENTION

The present invention relates to a device for current measuring in power supply networks with measuring current transformers, with a signal processing apparatus arranged on a printed circuit board and with screw fastenings for mounting the device.

BACKGROUND OF THE INVENTION

For current measurement in conductor systems measuring current transformers are known in which the current-carrying conductor to be measured is passed through a cable duct of the measuring current transformer in the form of a primary winding, and in the secondary winding of the measuring current transformer generates a measuring signal that is proportional to said primary current that can be analysed and which can be fed to an analysing device, for instance a conventional current measuring device, for displaying or to an analysing device for further digital signal processing. Such measuring current transformers are employed in electrical protection devices for fault current measurement (differential current measurement) in earthed (TN) networks, for test current measurement in connection with insulation fault localization devices in unearthed (IT) networks and independently of the type of network in devices for load-current measurement.

The devices for fault, test and load current measurement are frequently characterized by a spatially separated arrangement of the measuring current transformer and the signal-processing analysing device. Hence, from the prior art measuring devices for insulation fault localization are known, in which the measuring current transformers are arranged as separate units separately from the device which carries the electronics for processing the measuring signals delivered by the current measuring transformers. The connection between the individual measuring current transformers and the signal-processing device is generally produced by means of twisted cables. It is a disadvantage for installation in switch cabinets that arrangements of this type require much space as a consequence of the multiplicity of separately mounted measuring current transformers and the supply lines thereof, are confusing to some extent and are inflexible with regards to the installation position. The signal-processing device is fastened in a switch cabinet, for the most part on a top-hat rail, whereas the transformer elements are mounted via spacers or deep angle brackets in a plane lying there behind.

Likewise known are devices for locating insulation faults, in which the processing electronics and the measuring current transformers are combined in a device. A device of this type is disclosed in the laid-open specification DE 10 2005 054 544 A1.

This document describes an apparatus for locating insulation faults in unearthed AC voltage networks, in which a module consisting of a plurality of current transformers has a microprocessor with bus interface and this module is arranged via deep angle brackets in a second rear plane lowered between two top-hat rails in each case. In this case, the current transformers are arranged in two rows standing in an offset manner on a printed circuit (base) board of the module in such a manner that the cable openings of the current transformers are arranged pointing forwards at right angles to the top-hat rails in the mounted state of the module and the cables run vertically through the openings.

Although an extensive wiring is dispensed with in this apparatus due to the integration of the transformers, the installation options are also limited here, as an expedient mounting is only possible with deep angle brackets in a plane of the switch cabinet lying behind the top-hat rail.

SUMMARY OF THE INVENTION

The present invention is therefore based on the object of developing a device for current measuring in power supply networks in such a manner that the same forms a module which is as compact as possible and can be mounted in a multiplicity of installation positions.

This object is achieved in connection with the first embodiment in that cable ducts of the measuring current transformers are orientated parallel to a printed circuit board plane, the printed circuit board having openings flush to the cable ducts of the measuring current transformers and the screw fastenings being constructed as fastening tabs with mounting holes, the spacings of which are dimensioned in such a manner that a standards-compliant mounting is possible.

More specifically, in accordance with a first embodiment of the present invention, a device for current measuring in power supply networks is provided with measuring current transformers (14), with a signal processing apparatus (16) arranged on a printed circuit board (20) and with screw fastenings (26) for mounting the device (18), characterised in that cable ducts (24) of the measuring current transformers (14) are orientated parallel to a printed circuit board plane, wherein the printed circuit board (20) has openings (36) flush to the cable ducts (24) of the measuring current transformers (14) and the screw fastenings (26) are constructed as fastening tabs (26) with mounting holes (28), the spacings of which are dimensioned in such a manner that a standards-compliant mounting is possible. In accordance with a second embodiment of the present invention, the first embodiment is modified so that the fastening tabs (26) of the screw fastening (26) are orientated parallel to the printed circuit board plane. In accordance with a third embodiment of the present invention, the first embodiment and the second embodiment are modified so that the fastening tabs (26) of the screw fastening (26) are orientated perpendicularly to the printed circuit board plane.

In accordance with a fourth embodiment of the present invention, the first embodiment, the second embodiment and the third embodiment are modified so the measuring current transformers (14) are installed with the printed circuit board (20) in a common housing (22), on the housing edges of which the fastening tabs (26) of the screw fastening (26) are integrally moulded. In accordance with a fifth embodiment of the present invention, the fourth embodiment is modified so the housing (22) is realised as an injection moulded part into which the measuring current transformers (14) and the printed circuit board (20) are cast.

In accordance with a sixth embodiment of the present invention, a device for current measuring in power supply networks is provided with measuring current transformers (14), with a signal processing apparatus (16) arranged on a printed circuit board (20) and with screw fastenings (26) for mounting the device (18), characterised in that cable ducts (24) of the measuring current transformers (14) are orientated perpendicularly to the printed circuit board plane and the screw fastenings (26) are constructed as angle rail with cable outlets and standards-compliant mounting holes (28), on the one side of which the printed circuit board (20) is internally fastened. In accordance with a seventh embodiment of the present invention, a device for current measuring in power supply networks is provided with measuring current transformers (14), with a signal processing apparatus (16) arranged on a printed circuit board (20) and with screw fastenings (26) for mounting the device (18), characterised in that the cable ducts (24) of the measuring current transformers (14) are orientated perpendicularly to the printed circuit board plane, wherein the measuring current transformers (14) are installed with the printed circuit board (20) in a common housing (22) which has fastening tabs (26) provided with standards-compliant mounting holes (28) as screw fastenings (26).

In accordance with a eighth embodiment of the present invention, the first embodiment, the second embodiment, the third embodiment, the fourth embodiment, the fifth embodiment, the sixth embodiment and the seventh embodiment are modified so the measuring current transformers (14) are arranged in a row on a printed circuit board (20). In accordance with a ninth embodiment of the present invention, the first embodiment, the second embodiment, the third embodiment, the fourth embodiment, the fifth embodiment, the sixth embodiment, the seventh embodiment and the eighth embodiment are modified so the measuring current transformers (14) are arranged offset in a plurality of rows on the printed circuit board (20). In accordance with a tenth embodiment of the present invention, the first embodiment, the second embodiment, the third embodiment, the fourth embodiment, the fifth embodiment, the sixth embodiment, the seventh embodiment, the eighth embodiment and the ninth embodiment are modified so the signal processing apparatus (16) has an analysing unit (48) for the continuous analysis of the measuring current transformer signals and therefore for the detection of a plurality of simultaneously occurring incidences.

In accordance with an eleventh embodiment of the present invention, the first embodiment, the second embodiment, the third embodiment, the fourth embodiment, the fifth embodiment, the sixth embodiment, the seventh embodiment, the eighth embodiment, the ninth embodiment and the tenth embodiment are modified so the signal processing apparatus (16) has a microprocessor with communication interface. In accordance with a twelfth embodiment of the present invention, the first embodiment, the second embodiment, the third embodiment, the fourth embodiment, the fifth embodiment, the sixth embodiment, the seventh embodiment, the eighth embodiment, the ninth embodiment, the tenth embodiment and the eleventh embodiment are modified to additionally comprise a rotary switch (32) for the input of a device address. In accordance with a thirteenth embodiment of the present invention, the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment and the twelfth embodiment are modified so an LED indicator (34) for indicating an incident and for indicating status signals is assigned to each measuring current transformer (14).

In accordance with a fourteenth embodiment of the present invention, the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment, the twelfth embodiment and the thirteenth embodiment are modified to additionally comprise a module for arc detection (54). In accordance with a fifteenth embodiment of the present invention, the first embodiment, the second embodiment, the third embodiment, the fourth embodiment, the fifth embodiment, the sixth embodiment, the seventh embodiment, the eighth embodiment, the ninth embodiment, the tenth embodiment, the eleventh embodiment, the twelfth embodiment, the thirteenth embodiment and the fourteenth embodiment are modified so the fastening with a top-hat-rail clip (60) attached on the fastening tab (26) for mounting on a top-hat rail (44). In accordance with a sixteenth embodiment of the present invention, the fifteenth embodiment is modified so the top-hat-rail clip (60) is constructed as an angled T-shaped element.

By means of the arrangement according to the invention of the measuring current transformers in such a manner that the cable ducts thereof are orientated parallel to the printed circuit board plane, thus the toroidal core transformers are arranged lying on the printed circuit board, a particularly compact arrangement which takes up little space materialises. The printed circuit board in this case has openings flush to the cable ducts of the measuring current transformers lying flat on the printed circuit board, through which openings the cable outlets comprised by the respective measuring current transformers are guided. The screw fastenings are constructed as fastening tabs with mounting holes so that a direct screwing on the mounting rails of a switch cabinet is advantageously possible without the use of a top-hat rail. The spacings of the mounting holes are dimensioned in such a manner that a standards-compliant installation on the mounting rails can be carried out without further fastening elements or adapters.

In a further advantageous configuration, the fastening tabs of the screw fastening are orientated parallel to the printed circuit board plane. This orientation of the fastening tabs allows a mounting of the device in such a manner that the printed circuit board can be screwed on the mounting rails parallel to a rear wall. As a consequence of the measuring current transformers lying flat, the device occupies a small overall depth in this installation position and additionally allows space-saving installation between two circuit breaker blocks mounted on top-hat rails in a switch cabinet. The power cables are therefore guided horizontally through the cable ducts of the measuring current transformers running parallel to the printed circuit board or to the wall, as well as through the flush openings of the printed circuit board.

It proves expedient that the fastening tabs of the screw fastening—in combined arrangement with the previously mentioned fastening tabs orientated parallel to the printed circuit board plane or exclusively—are orientated perpendicularly to the printed circuit board plane. With this orientation of the fastening tabs, a lying installation position of the device is possible, in which the printed circuit board with the measuring current transformers lying flat has a small overall height. In this mounting position, the power cables comprised run vertically through the cable ducts or through the flush openings.

Preferably, the measuring current transformers are installed with the printed circuit board in a common housing, on the housing edges of which the fastening tabs of the screw fastening are integrally moulded. The common housing accommodates the individual transformers and the printed circuit board carrying the signal processing apparatus. The fastening tabs are integrally moulded onto the housing in a parallel and/or perpendicular orientation to the printed circuit board plane. Thus, a very compact, protected and reliable structural unit is created.

Expediently, the housing is realised as an injection moulded part into which the measuring current transformers and the printed circuit board are cast. In addition to the compactness of the device, this embodiment also proves mechanically particularly robust.

Furthermore, the object on which the invention is based is achieved with an alternative solution in connection with the sixth embodiment in that cable ducts of the measuring current transformers are orientated perpendicularly to the printed circuit board plane and the screw fastenings are constructed as angle rail with cable outlets and standards-compliant mounting holes, on the one side of which the printed circuit board is internally fastened.

In this solution variant, the measuring current transformers are mounted standing on the printed circuit board—that is to say with the cable ducts thereof orientated perpendicularly to the printed circuit board plane—and the printed circuit board itself if fixed internally on a first side of an angle rail, the second side of the angle rail, which is perpendicular to the first side, having outlets for inserting the cables, which are flush with the cable ducts of the measuring current transformers. Advantageously, the angle bracket is provided with standards-compliant mounting holes on both sides in the respective outer regions, so that an installation position is possible, in which the printed circuit board can be fastened parallel to a mounting wall or perpendicularly to the wall plane on mounting rails. Furthermore, the option of a vertical installation along a mounting rail also exists in each case. A multiplicity of advantageous installation positions therefore results for the orientation of the measuring current transformers arranged standing on the printed circuit board and therefore for the cable guidance of the comprised cables.

Likewise, the object on which the invention is based is achieved with a further alternative solution in connection with the seventh embodiment in that the cable ducts of the measuring current transformers are orientated perpendicularly to the printed circuit board plane, whereby the measuring current transformers are installed with the printed circuit board in a common housing which has fastening tabs provided with standards-compliant mounting holes as screw fastenings.

In this alternative solution also, the measuring current transformers are mounted standing on the printed circuit board, however the measuring current transformers are installed with the printed circuit board in a common protective rectangular housing. The fastening tabs are advantageously attached to the housing in such a manner that a wall-parallel orientation of the cable ducts of the measuring current transformers as well as an installation position perpendicular to the wall are possible. Also, in the case of transformers orientated parallel to the wall, a hanging position of the transformers with printed circuit board located thereabove can also be realised.

In all alternative solutions, particularly however in the first embodiment with measuring current transformers arranged lying flat on the printed circuit board, the measuring current transformers can be arranged in a row on the printed circuit board. Thus, a narrowly constructed longitudinal element results that allows the arrangement of a plurality of devices in a plane above one another and is ideally orientated towards standards-compliant spacing between two mounting rails.

In another configuration, the measuring transformers are arranged offset in a plurality of rows. In the case of measuring current transformers arranged lying on the printed circuit board, the device can therefore assume a rather square basic shape, as a result of which two configurations of this type can preferably be arranged next to one another. Also, combined special designs with transformers arranged in one and two rows are conceivable.

It is furthermore advantageous that the signal processing apparatus has an analysing unit for the continuous analysis of the measuring current transformer signals and therefore for the detection of a plurality of simultaneously occurring incidences. Hence, using the inventive device, simultaneously occurring insulation faults (incident in unearthed networks) or also simultaneously occurring fault currents (incident in earthed networks) can be detected. Independently of the installed type of network the incident can also be the simultaneous measurement of a plurality of load currents.

In order to enable a flexible adaptation to the respective operating environment and to be able to be integrated into an overarching monitoring concept, the signal processing apparatus has a microprocessor with communication interface. Expediently, the device has rotary switches for the direct input of a device address and thus enables an integration into a network with a plurality of devices for current measurement. The network can have a bus structure in this case.

An LED indicator for indicating an incident and for indicating status signals is assigned to each measuring current transformer. Thus the operating personnel can see immediately in which cable outlet a current is flowing.

In a further embodiment, a module for arc detection is integrated into the device. This makes it possible to make use of the same measuring current transformer for detecting a current which arises for example in the event of the breaking away of a cable and, as a result, to detect an arc. The module has additional filters for the spectral analysis of this current. The common use of supply voltage, housing and communication interface is of advantage.

BRIEF DESCRIPTION OF THE DRAWINGS

Further advantageous configuration features result from the following description and the drawings which explain a first embodiment of the invention with reference to examples. In the figures:

FIG. 3 shows a printed circuit board of the device according to the invention in a first embodiment, FIGS. 4a, 4b show devices of the first embodiment connected to mounting rails in various installation positions.

DETAILED DESCRIPTION OF THE INVENTION

Figure 1:
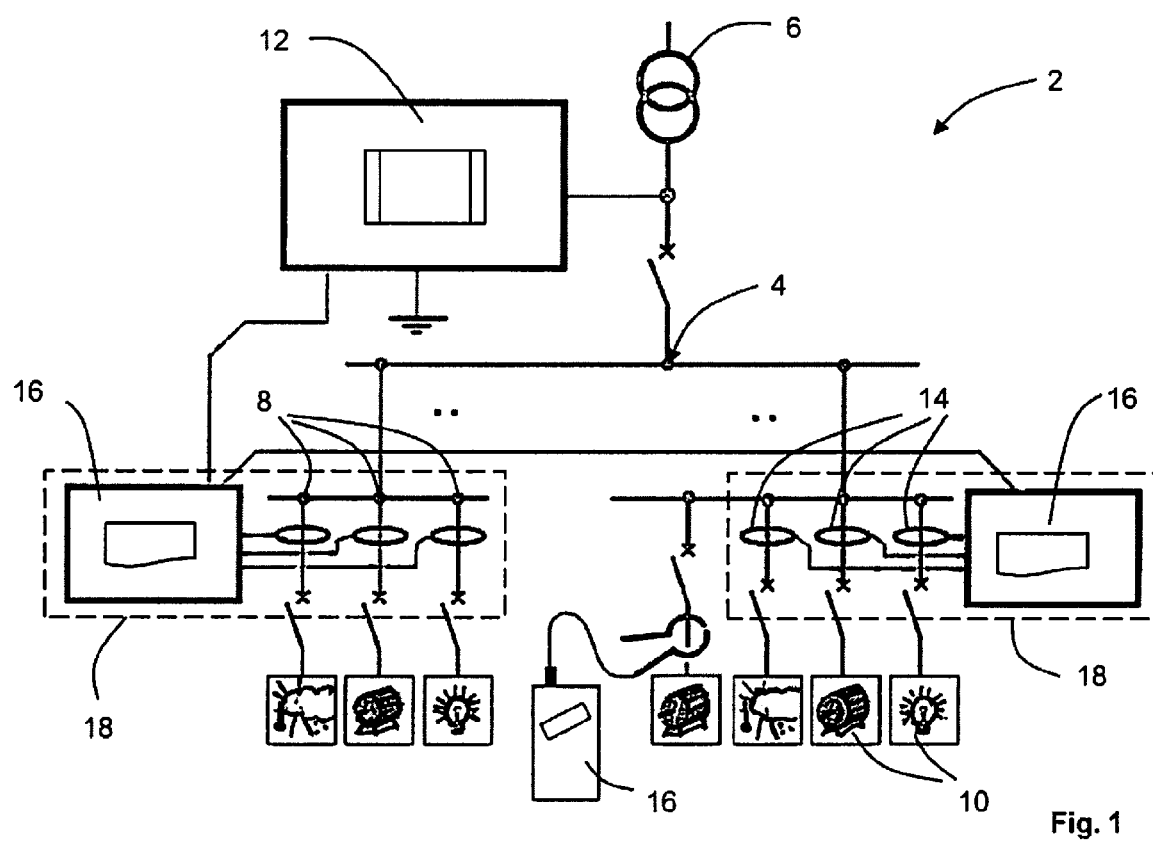
FIG. 1 shows the integration of an inventive device for current measurement in a power supply network.

FIG. 1 with the example of an insulation fault localization device 2 shows the integration of an inventive device 18 for (test) current measurement in an unearthed power supply network 4. The power supply network 4 is supplied by a power infeed 6 and has different cable outlets 8 to which consumers 10 are connected. An insulation monitoring device 12 monitors the insulation resistance of the power supply network 4. If the insulation resistance between mains cable and earth falls below a set threshold, the insulation fault localisation is started automatically or manually. To this end, the insulation monitoring device 12 generates a test current which flows via the live cables and the cable outlets 8 to the insulation fault location and from there via the earth cable back to the insulation monitoring device 12. The test signal is detected by all of the measuring current transformers 14 which are located in this test signal circuit. The measuring current transformers are connected to a signal processing apparatus 16 for analysing the detected signals that produces the assignment between the measuring current transformers 14 and cable outlet 8 and therefore localises the fault location. The integration of the measuring current transformers 14 and the signal processing apparatus 16 into one structural unit leads to an inventive device 18. The inventive device 18 is also suitable for measuring the load currents flowing in the cable outlets 8 or in connection with a fault current protection circuit in earthed systems 4 (instead of the unearthed power supply network 4) for detecting differential currents.

Figures 2A, 2B:
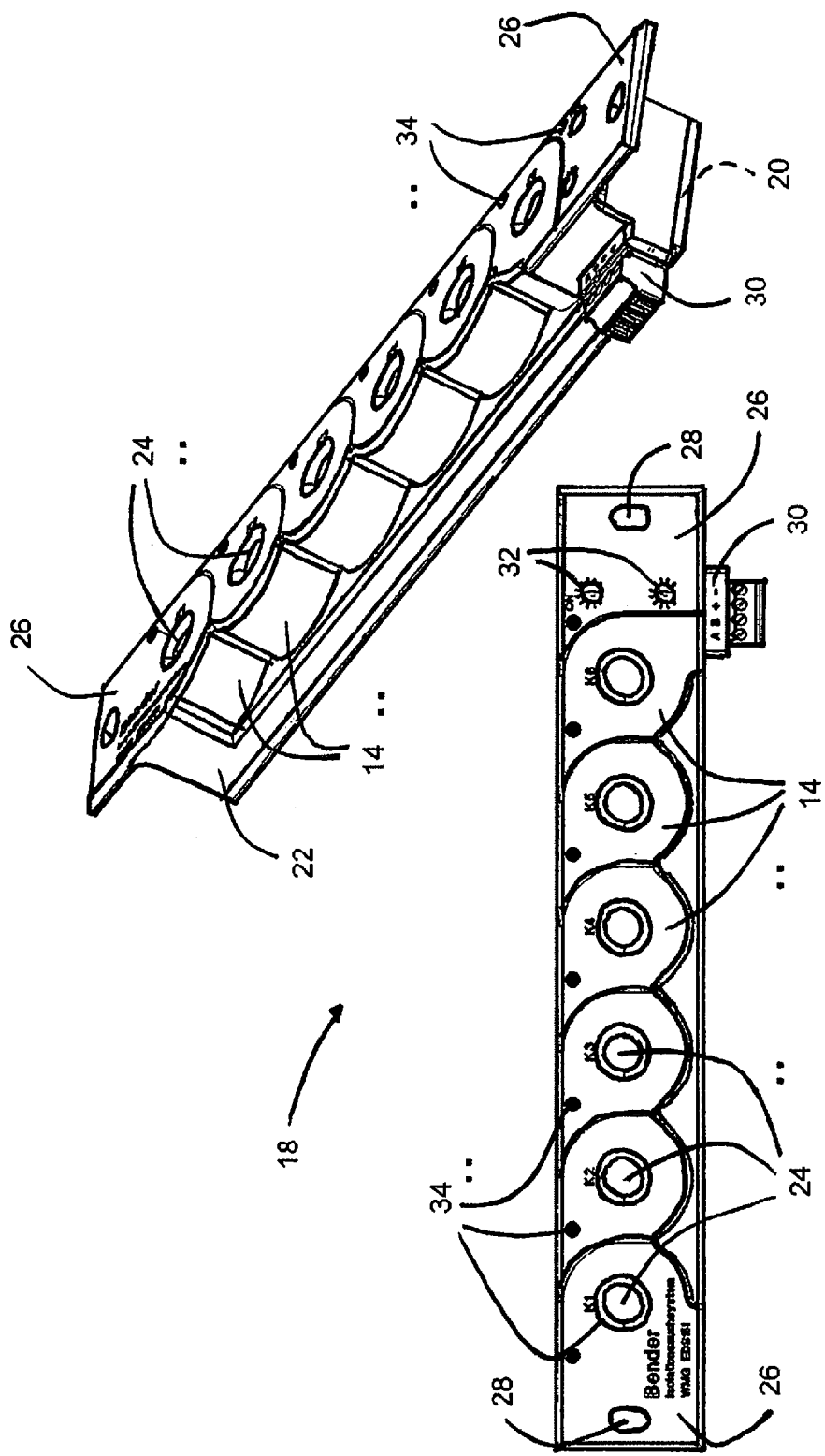
FIGS. 2a, 2b show the inventive device in the preferred first embodiment in a plan view and in a perspective illustration.

In FIGS. 2a and 2b, the inventive device 18 can be seen in the preferred first embodiment. In this embodiment, the device 18 consists of six measuring current transformers 14 which are arranged lying in a row on a printed circuit board 20 (FIG. 3), whereby cable ducts 24 of the measuring current transformers 14 are orientated parallel to a printed circuit board plane. The six measuring current transformers 14 are cast with the printed circuit board 20 into a common housing 22 realised as an injection moulded part. Fastening tabs 26 that end flush with the upper side of the cable ducts 24 are moulded onto the narrow sides thereof, the mounting holes 28 of which tabs are realised as slots. The housing 22 has a 4-pole communication interface 30 which can be realised as a bus interface and is used for linking the device to a power supply monitoring system. Two rotary switches 32 on the upper side of the housing 22 enable the currentless input of a device address. An LED indicator 34 for individual fault and status indication is located on each measuring current transformer 14 on the housing upper side.

FIG. 3 shows a printed circuit board layout of the printed circuit board 20 of the device 18 according to the invention in the embodiment according to the FIGS. 2a and 2b. The openings 36 of the printed circuit board 20 which are flush with the cable ducts 24 of the measuring current transformers 14 (FIGS. 2a, 2b) as well as the printed circuit board through holes 38 for connecting the LED indicator supply cables can be seen. In the right edge region of the printed circuit board 20, there is a tab 40 for accommodating a microprocessor and the (physical) communication interface 30 (FIGS. 2a, 2b).

In FIG. 4a and FIG. 4b, the device 18 is fastened—at the standards-compliant spacing—directly to two mounting rails 42. In a first installation position A, the device 18 is placed onto the mounting rails 42 at the front, in a second installation position B, the device 18 is mounted likewise at the front, but rotated through 180° and in a third installation position C, a rear arrangement of the device 18 is possible.

Top-hat rails 44 are fastened in the vertical direction on the mounting rails 42 between the devices 18, onto which other electrical equipment can be mounted. A top-hat rail 44 as fastening holder for the device 18 according to the invention can be dispensed with in both installation positions A, B. It is apparent that due to the compact structure of the device 18, an arrangement which is as space-saving as possible, even of a plurality of devices 18 one above the other, is achieved.

Figure 5:
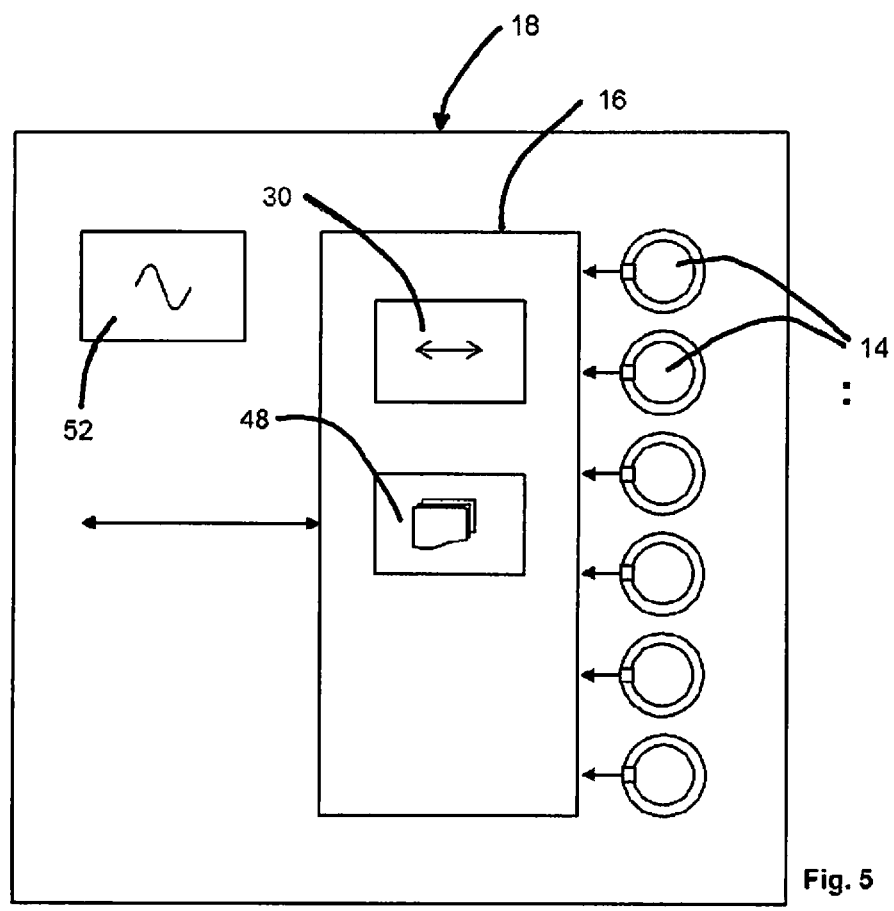
FIG. 5 shows a functional block diagram of the device according to the invention and FIG. 6 shows a functional block diagram of the device according to the invention with integrated unit for arc detection.
Figure 6:
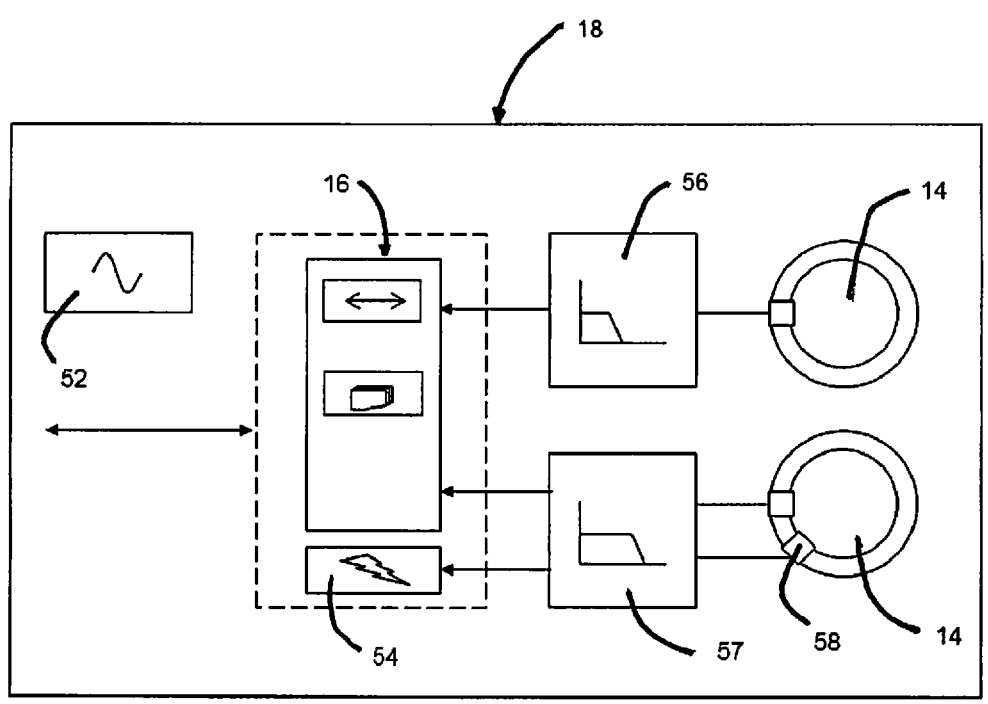

A functional block diagram of the device 18 according to the invention can be seen in FIG. 5. The device 18 essentially consists of a number of measuring current transformers 14—it being possible to freely determine the number of measuring current transformers 14 during the design of the device 14, principally in accordance with the electrical and structural arrangements—and the signal processing apparatus 16 as well as a power supply unit 52 for its own power supply. In the exemplary embodiment shown, the signal processing apparatus 16 comprises the (logical) communication interface as well as an analysing unit 48 for the continuous analysis of the measuring current transformer signals. Thus in unearthed systems a plurality of simultaneously occurring insulation faults can be detected by one test current measurement, and in earthed systems a plurality of simultaneously occurring fault currents can be detected in the differential current measurement. Moreover, the inventive device 18 enables the simultaneous measurement of a plurality of load currents. The functional blocks 30, 48 of the signal processing apparatus 16 can in this case be implemented as computer programs on a microprocessor A further embodiment of the device 18 according to the invention is shown in the functional block diagram from FIG. 6. In addition to the measuring current detection and analysis with the signal processing apparatus 16 via the filter 56, a module for arc detection 54 is integrated into this configuration. The module 54 uses a separate filter 57, to which a separate transformer coil 58 is connected that supplies a measuring signal for detecting the current characterising an arc.

Figure 7:
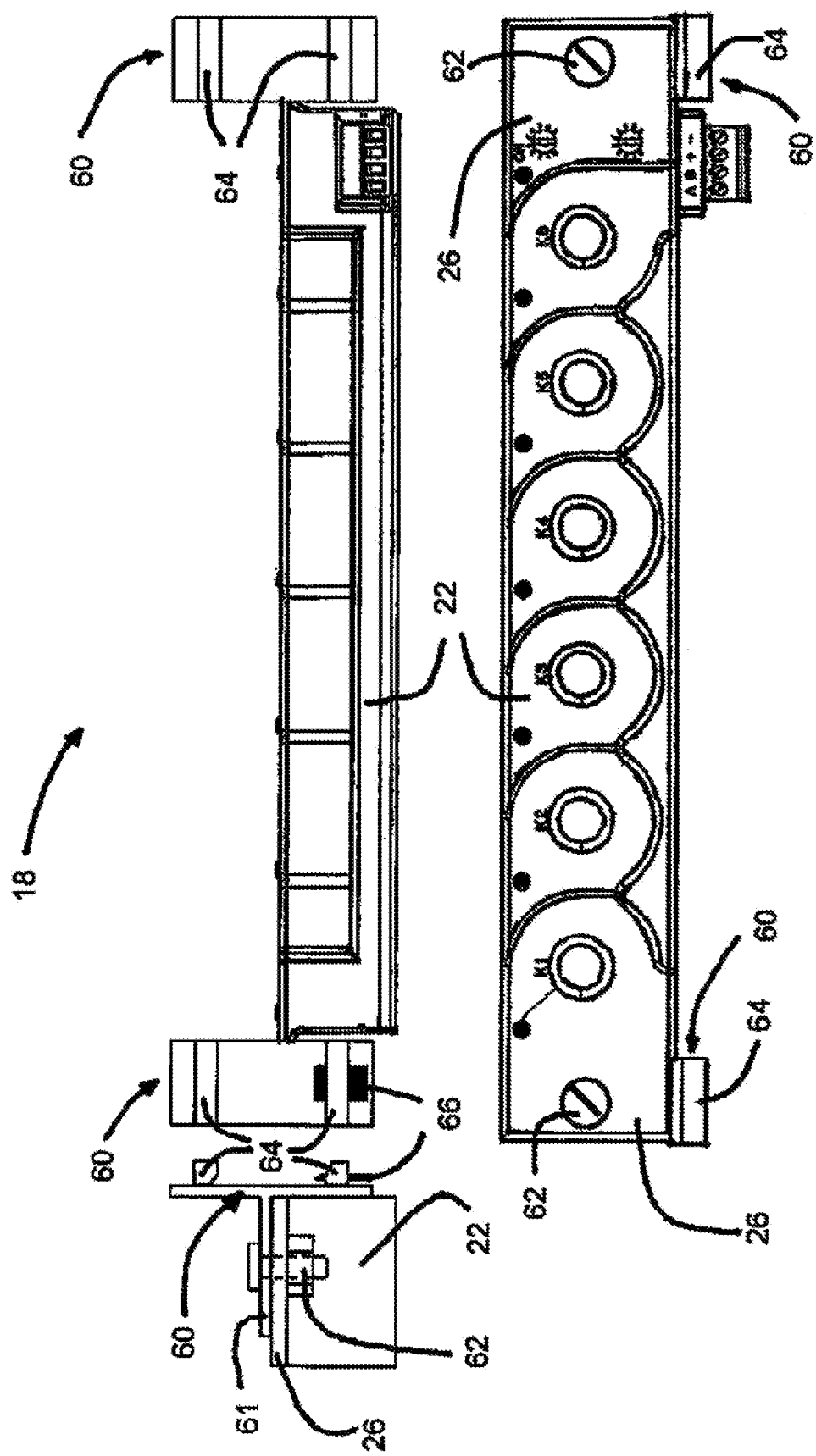
FIG. 7 shows the preferred first embodiment of the device according to the invention with an alternative fastening.

The FIG. 7 shows a further fastening option of the device according to the invention. In this case, in connection with the first preferred embodiment according to FIGS. 2a, 2b, top-hat-rail clips 60 for latching with the top-hat rail 44 are attached on the two moulded-on fastening tabs 26 of the housing 22. The top-hat-rail clips 60 are constructed as angled T-shaped elements, the respective mounting bracket 61 of which are connected to the fastening tabs 26 by means of screw fastening 62 in such a manner that in each case two catches 64 of a top-hat-rail clip 60 can be latched on the top-hat rail 44 in a plane which is perpendicular to the printed circuit board plane. In addition, the connection to the top-hat rail 44 can be secured with a securing element 66. Also, the top-hat-rail clips 60 can be realised without a mounting bracket 61 as conventional top-hat-rail clips 60 that lie with a side face on the fastening tabs 26 and are screwed to the same directly via the mounting holes 28 on the fastening tabs 26.

The invention claimed is:

1. A device for current measuring in power supply networks comprising:
   (a) a plurality of current-measuring transformers wherein each transformer has a cable duct;
   (b) a signal processing apparatus arranged on a printed circuit board; and
   (c) a plurality of screw fastenings for mounting the device, wherein
   the cable ducts of the plurality of current-measuring transformers are orientated parallel to a printed circuit board plane, wherein the printed circuit board has a plurality of openings flush to the cable ducts of the plurality of current-measuring transformers and the plurality of screw fastenings are constructed as a plurality of fastening tabs with a plurality of mounting holes, wherein the plurality of mounting holes are spaced to allow a standards-compliant mounting.

2. The device according to claim 1, wherein the plurality of fastening tabs of the plurality of screw fastening are orientated parallel to the printed circuit board plane.

3. The device according to claim 1, wherein the plurality of fastening tabs of the plurality of screw fastening are orientated perpendicularly to the printed circuit board plane.

4. The device according to claim 1, wherein the plurality of current-measuring transformers are installed with the printed circuit board in a housing, and wherein the plurality of fastening tabs of the plurality of screw fastening are integrally moulded on a plurality of edges of the housing.

5. The device according to claim 4, wherein the housing is realised as an injection moulded part into which the plurality of current-measuring transformers and the printed circuit board are cast.

6. A device for current measuring in power supply networks comprising:
   (a) a plurality of current-measuring transformers, wherein each of the plurality of current-measuring transformers has a cable duct;
   (b) a signal processing apparatus arranged on a printed circuit board; and
   (c) a plurality of screw fastenings for mounting the device, wherein
   the cable ducts (24) of the plurality of current-measuring transformers are orientated perpendicularly to a plane of the printed circuit board, wherein the screw fastenings are constructed as an angle rail with a plurality of cable outlets and a plurality of standards-compliant mounting holes, and wherein the printed circuit board is internally fastened on a side of the angle rail.

7. A device for current measuring in power supply networks comprising:
   (a) a plurality of current-measuring transformers, wherein each of the plurality of transformers has a cable duct;
   (b) a signal processing apparatus arranged on a printed circuit board; and
   (c) a plurality of screw fastenings for mounting the device, wherein
   the cable ducts of the plurality of transformers for measuring current are orientated perpendicularly to a plane of the printed circuit board, wherein the plurality of current-measuring transformers are installed with the printed circuit board in a housing that has a plurality of fastening tabs provided with a plurality of standards-compliant mounting holes as the plurality of screw fastenings.

8. The device according to claim 1, wherein the plurality of current-measuring transformers are arranged in a row on the printed circuit board.

9. The device according to claim 1, wherein the plurality of current-measuring transformers are arranged offset in a plurality of rows on the printed circuit board.

10. The device according to claim 1, wherein the signal processing apparatus has an analysing unit for the continuous analysis of signals from the plurality of current-measuring transformers and therefore for the detection of a plurality of simultaneously occurring incidences.

11. The device according to claim 10, wherein the signal processing apparatus has a microprocessor with a communication interface.

12. The device according to claim 1, further comprising:
   (d) a rotary switch arranged to input a device address.

13. The device according to claim 1, wherein each of the plurality of current-measuring transformers is assigned an LED indicator for indicating an incident and for indicating status signals.

14. The device according to claim 1, further comprising:
   (d) a module for arc detection.

15. The device according to claim 1, wherein a top-hat-rail clip attached on each of the plurality of fastening tabs for mounting on a top-hat rail.

16. The device according to claim 15, wherein the top-hat-rail clip is constructed as an angled T-shaped element.

17. The device according to claim 6, wherein the plurality of current-measuring transformers are arranged in a row on the printed circuit board.

18. The device according to claim 7, wherein the plurality of current-measuring transformers are arranged in a row on the printed circuit board.

19. The device according to claim 6, further comprising:
   (d) a rotary switch for the input of a device address.

20. The device according to claim 7, further comprising:
   (d) a rotary switch for the input of a device address.

* * * * *